(12) United States Patent
Xiong et al.

(10) Patent No.: US 11,429,163 B2
(45) Date of Patent: Aug. 30, 2022

(54) HOT SPOT COOLING FOR DATA STORAGE SYSTEM

(71) Applicant: Western Digital Technologies, Inc., San Jose, CA (US)

(72) Inventors: Shaomin Xiong, Fremont, CA (US); Hussam Zebian, San Jose, CA (US); Haoyu Wu, Sunnyvale, CA (US); Toshiki Hirano, San Jose, CA (US); Jeff Wilke, Palmer Lake, CO (US); Timothy Skarzynski, Colorado Springs, CO (US)

(73) Assignee: Western Digital Technologies, Inc., San Jose, CA (US)

( * ) Notice: Subject to any disclaimer, the term of this patent is extended or adjusted under 35 U.S.C. 154(b) by 110 days.

(21) Appl. No.: 16/417,572

(22) Filed: May 20, 2019

(65) Prior Publication Data

US 2020/0371568 A1 Nov. 26, 2020

(51) Int. Cl.
*G06F 1/20* (2006.01)
*H05K 7/20* (2006.01)
*G06F 1/18* (2006.01)

(52) U.S. Cl.
CPC ............... *G06F 1/20* (2013.01); *G06F 1/181* (2013.01); *H05K 7/2039* (2013.01); *H05K 7/2049* (2013.01); *H05K 7/20418* (2013.01); *H05K 7/20445* (2013.01); *H05K 7/20518* (2013.01); *H05K 7/20481* (2013.01)

(58) Field of Classification Search
CPC .......... H05K 7/20418; H05K 7/20518; H05K 7/2049; H05K 7/20445; H05K 7/2039; H05K 7/20481; G06F 1/20; G06F 1/181
See application file for complete search history.

(56) References Cited

U.S. PATENT DOCUMENTS

| 5,768,104 A | 6/1998 | Salmonson et al. |
| 6,449,156 B1 * | 9/2002 | Han ................. G11C 5/04 361/704 |
| 7,768,785 B2 | 8/2010 | Ni et al. |
| 9,756,766 B2 | 9/2017 | Best |

(Continued)

FOREIGN PATENT DOCUMENTS

WO WO2014019064 A1 2/2014

OTHER PUBLICATIONS

International Search Report and Written Opinion for counterpart PCT/US2019/068602, dated Apr. 30, 2020, 8 pages, ILPO.

(Continued)

*Primary Examiner* — Rockshana D Chowdhury
*Assistant Examiner* — Douglas R Burtner
(74) *Attorney, Agent, or Firm* — John D. Henkhaus

(57) ABSTRACT

A data storage system may include multiple data storage devices, such as solid-state drives, an enclosure housing the devices, and a thermal bridge positioned in a gap between and in contact with each of the enclosure and a device, where the enclosure is cooler than the device. Thus, heat is conducted away from a hot spot of the device and to the enclosure. The thermal bridge may be flexible enough to bridge different sized gaps, while stiff enough to generate contact forces applied to the enclosure and the device. For example, the thermal bridge may be constructed primarily of copper and configured to function like a compression spring.

15 Claims, 4 Drawing Sheets

(56) References Cited

U.S. PATENT DOCUMENTS

| | | | |
|---|---|---|---|
| 9,894,801 B1* | 2/2018 | Marroquin | H05K 7/20254 |
| 10,372,168 B1* | 8/2019 | He | G06F 1/206 |
| 10,558,247 B2* | 2/2020 | Smith | G06F 1/182 |
| 10,575,437 B1* | 2/2020 | Christiansen | H05K 7/20518 |
| 11,089,717 B2* | 8/2021 | Stathakis | G11B 33/1426 |
| 2011/0019356 A1* | 1/2011 | Moriai | G06F 1/20 361/679.32 |
| 2011/0199748 A1* | 8/2011 | Kagawa | H05K 7/20436 361/796 |
| 2012/0327595 A1* | 12/2012 | Caldwell | G11B 33/08 361/679.59 |
| 2013/0003320 A1* | 1/2013 | Dunham | H05K 1/141 248/220.21 |
| 2013/0214406 A1* | 8/2013 | Schultz | H01L 25/0655 257/713 |
| 2014/0022733 A1* | 1/2014 | Lim | H05K 7/20445 361/718 |
| 2014/0063721 A1 | 3/2014 | Herman et al. | |
| 2014/0111933 A1* | 4/2014 | Knopf | G11B 33/08 361/679.34 |
| 2014/0218859 A1* | 8/2014 | Shelnutt | H05K 7/20809 361/679.46 |
| 2014/0306335 A1* | 10/2014 | Mataya | G06F 1/18 257/713 |
| 2016/0128226 A1 | 5/2016 | Stellick et al. | |
| 2016/0290728 A1* | 10/2016 | Coteus | H01L 23/473 |
| 2016/0307818 A1* | 10/2016 | Kawase | H01L 23/3675 |
| 2017/0038802 A1 | 2/2017 | Kwon et al. | |
| 2017/0060195 A1* | 3/2017 | Kim | G06F 1/182 |
| 2017/0060199 A1* | 3/2017 | Kim | G06F 1/20 |
| 2018/0024600 A1* | 1/2018 | Horiuchi | G06F 1/20 361/679.31 |
| 2018/0177073 A1* | 6/2018 | Pickens | H05K 7/20445 |
| 2018/0210517 A1* | 7/2018 | Yun | G06F 3/0679 |
| 2019/0037725 A1* | 1/2019 | Uchino | G06F 1/16 |
| 2019/0104643 A1* | 4/2019 | Gwin | H01L 21/4878 |
| 2019/0215972 A1* | 7/2019 | Jang | H05K 5/0247 |
| 2019/0246508 A1* | 8/2019 | Oh | G06F 3/0679 |
| 2019/0265763 A1* | 8/2019 | Kim | G06F 1/20 |
| 2020/0084914 A1* | 3/2020 | Kumagai | H01L 23/3107 |
| 2020/0174533 A1* | 6/2020 | Long | G06F 1/187 |
| 2020/0214175 A1* | 7/2020 | Anglin Williams | H01L 23/42 |
| 2020/0221610 A1* | 7/2020 | Coteus | H01L 23/367 |
| 2020/0236812 A1* | 7/2020 | Smith | G11B 33/1406 |
| 2020/0260602 A1* | 8/2020 | Gao | G06F 1/20 |
| 2020/0337181 A1* | 10/2020 | Tian | F28F 3/12 |
| 2021/0015006 A1* | 1/2021 | Muto | H05K 1/0203 |
| 2021/0117364 A1* | 4/2021 | Yun | H01R 12/73 |
| 2021/0153382 A1* | 5/2021 | Saroor | H05K 5/0213 |

OTHER PUBLICATIONS

Gao et al., Reduced Cooling Redundancy: A New Security Vulnerability in a Hot Data Center, Network and Distributed Systems Security (NDSS) Symposium 2018, Feb. 18-21, 2018, 15 pages, San Diego CA USA, downloaded from http://wp.internetsociety.org/ndss/wp-content/uploads/sites/25/2018/02/ndss2018_06A-1_Gao_paper.pdf.

* cited by examiner

HOT SPOT COOLING FOR DATA STORAGE SYSTEM

FIELD OF EMBODIMENTS

Embodiments of the invention may relate generally to data storage systems, and particularly to reducing the temperature of data storage devices constituent to data storage systems.

BACKGROUND

There is a commercial demand for high-capacity digital data storage systems, in which multiple data storage devices (DSDs) are housed in a common enclosure. A DSD, such as a solid-state memory device (or "solid-state drive" (SSD)) and/or a hybrid drive, may experience a localized elevated temperature, or "hot spot". Hot spots often times manifest at or near the location of an ASIC (application-specific integrated circuit) or other integrated circuit (IC) such as the solid-state memory units (e.g., NAND-based flash memory), a network IC, a PCIe (peripheral component interconnect express) IC, and the like. The read/write performance is typically downgraded when the temperature of an ASIC or NAND flash reaches a throttling point, which refers to a temperature limit at which the data rate of the integrated circuit is intentionally reduced. While necessary to maintain the long-term operational capability of the integrated circuit, reduction in performance is otherwise undesirable.

Any approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

Embodiments are illustrated by way of example, and not by way of limitation, in the figures of the accompanying drawings and in which like reference numerals refer to similar elements and in which.

DETAILED DESCRIPTION

Generally, approaches to reducing the temperature of data storage devices within a data storage system are described. In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices are shown in block diagram form in order to avoid unnecessarily obscuring the embodiments of the invention described herein.

Illustrative Operating Context

Embodiments may be used in the context of an all-flash array (AFA) or other data storage system. Thus, in accordance with an embodiment, a perspective view illustrating an AFA 100 is shown in FIG. 1A to illustrate an exemplary operating context.

Figure 1A:
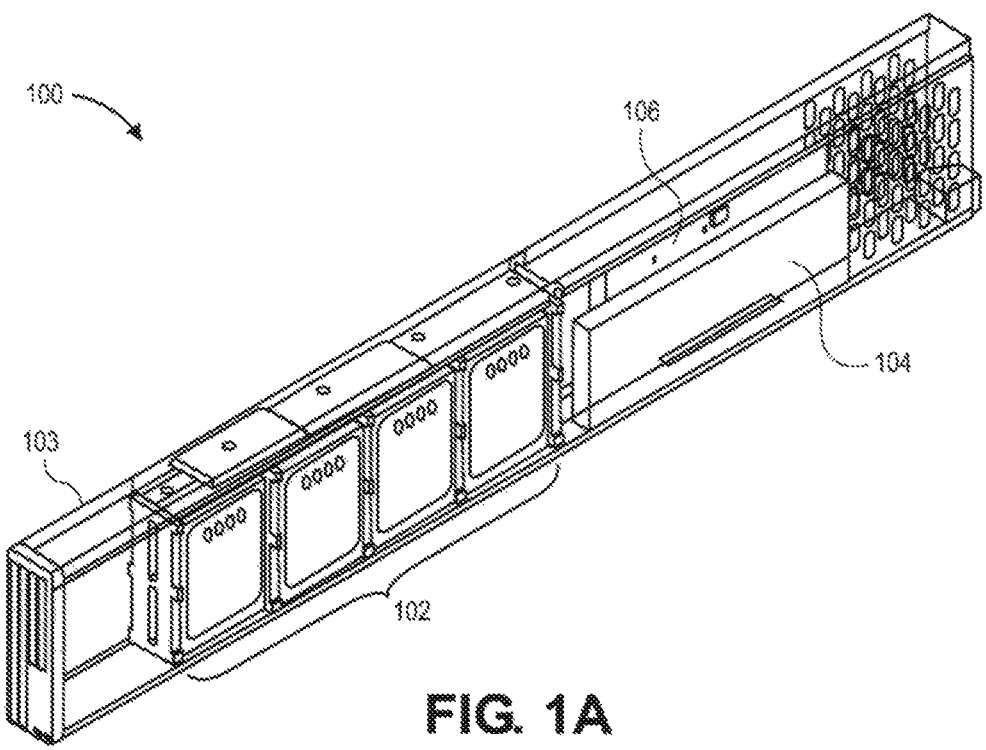
FIG. 1A is a perspective view illustrating an all-flash array, according to an embodiment.
Figure 1B:
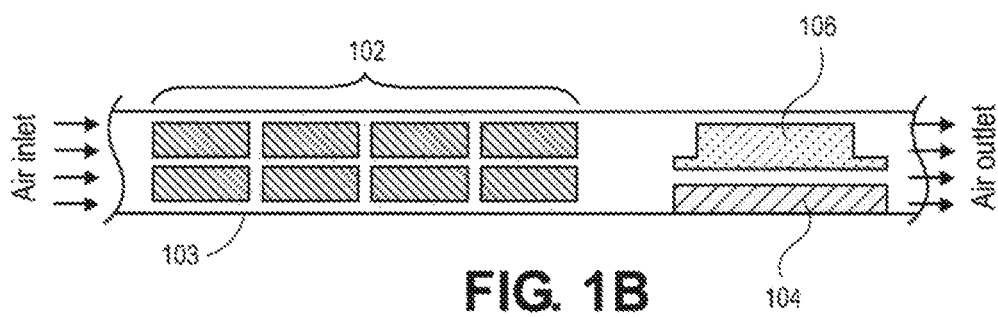
FIG. 1B is a diagrammatic side view illustrating the all-flash array of FIG. 1A, according to an embodiment.

FIG. 1A is a perspective view illustrating an all-flash array, and FIG. 1B is a diagrammatic side view illustrating the all-flash array of FIG. 1A, according to an embodiment. An all-flash array (AFA) 100 generally comprises a plurality of SSDs 102 (eight, in this exemplary illustration), a battery 104, and a PCIe card 106, all in a shared enclosure 103, which may comprise what may be referred to as "sleds" or "racks". Note that the gap between the SSDs and the enclosure wall, as well as the gap between SSDs in either direction, may vary from storage system to storage system and may even vary a bit among a given storage system, the significance of which is explained in more detail hereafter. As the capacity of SSDs increases with advancements in technology, likewise the amount of power consumed also increases, as does the consequent heat generated in the SSDs and in the storage system generally. Thus, there may be a tendency toward incorporating a bigger more capable cooling fan, which further increases the power draw as well as the cost. With that in mind, a different cooling mechanism beyond a cooling fan may be desirable.

References herein to a solid-state drive, such as SSD 102 illustrated in FIGS. 1A, 1B, may encompass an information storage device that is at times referred to as a "hybrid drive". A hybrid drive refers generally to a storage device having functionality of both a traditional spinning-disk HDD combined with solid-state drive using non-volatile memory, such as flash or other solid-state (e.g., integrated circuits) memory, which is electrically erasable and programmable. A hybrid drive may be architected and configured to operate and to utilize the solid-state portion in a number of ways, such as, for non-limiting examples, by using the solid-state memory as main non-volatile memory, as cache memory for storing frequently-accessed data and/or I/O intensive data, as an ASIC, and the like. Further, a hybrid drive may be architected and configured essentially as two storage devices in a single enclosure, i.e., a traditional HDD and an SSD, with either one or multiple interfaces for host connection.

Introduction

The term "substantially" will be understood to describe a feature that is largely or nearly structured, configured, dimensioned, etc., but with which manufacturing tolerances and the like may in practice result in a situation in which the structure, configuration, dimension, etc. is not always or necessarily precisely as stated. For example, describing a structure as "substantially vertical" would assign that term its plain meaning, such that the sidewall is vertical for all practical purposes but may not be precisely at 90 degrees.

While terms such as "optimal", "optimize", "minimal", "minimize", and the like may not have certain values associated therewith, if such terms are used herein the intent is that one of ordinary skill in the art would understand such terms to include affecting a value, parameter, metric, and the like in a beneficial direction consistent with the totality of this disclosure. For example, describing a value of something as "minimal" does not require that the value actually be equal to some theoretical minimum (e.g., zero), but should be understood in a practical sense in that a corresponding goal would be to move the value in a beneficial direction toward a theoretical minimum.

Thermal Bridge

According to embodiments, a thermal bridge is properly positioned between one or more data storage device of interest, such as SSD 102 of FIGS. 1A, 1B, and a "cold" (relative to the data storage device) wall or structure, such as enclosure 103 of FIGS. 1A, 1B, for conducting (and convecting) heat away from the SSD 102 to the cold structure.

Figure 2A:
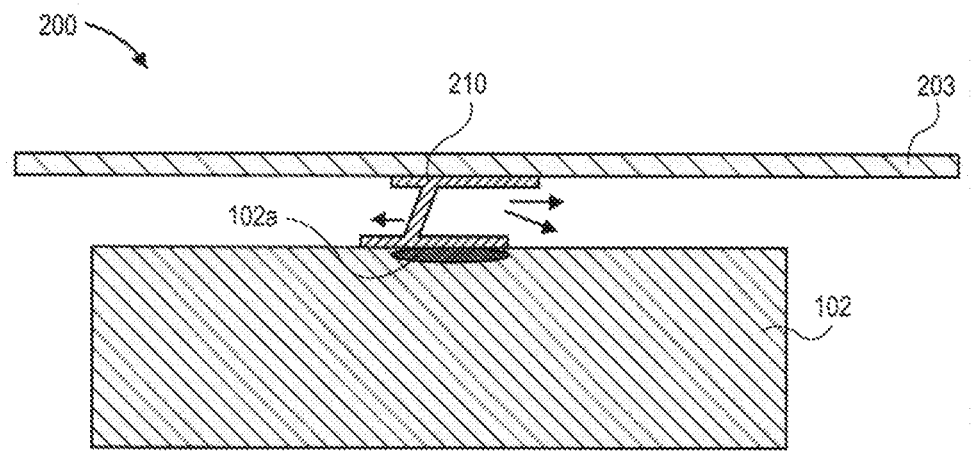
FIG. 2A is a diagrammatic side view illustrating a thermal bridge between a data storage device and a cold wall, according to an embodiment.
Figure 2B:
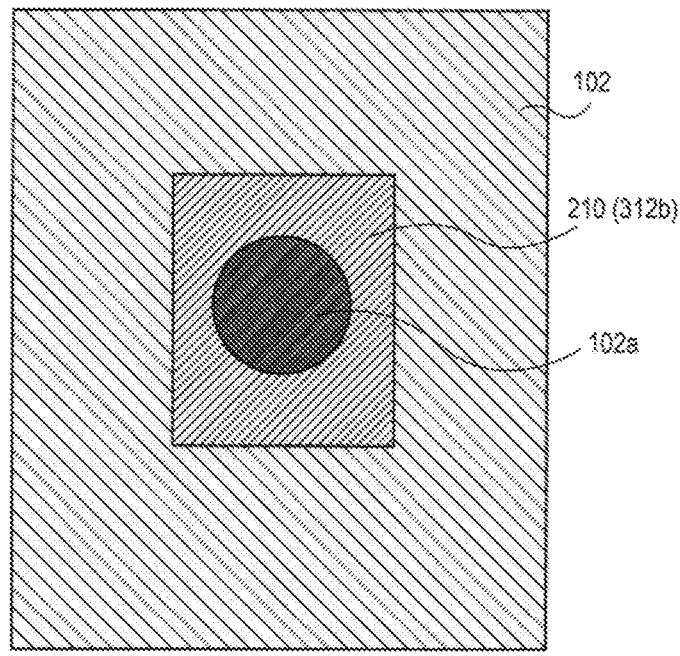
FIG. 2B is a diagrammatic top view illustrating the thermal bridge of FIG. 2A, according to an embodiment.

FIG. 2A is a diagrammatic side view illustrating a thermal bridge between a data storage device and a cold wall, and FIG. 2B is a diagrammatic top view illustrating the thermal bridge of FIG. 2A, according to an embodiment. Assembly 200 comprises a data storage device such as an SSD 102 having an associated "hot spot" 102a, i.e., an area of localized elevated temperature relative to its surroundings. Assembly 200 further comprises a thermal bridge 210 positioned in a gap between and in contact with both the SSD 102 and a cold structure 203 (e.g., structure that is relatively cooler, as in lower in temperature, than the SSD 102), such as a wall or other structural member of a system enclosure such as enclosure 103 (FIGS. 1A, 1B). According to an embodiment, the thermal bridge 210 or at least a portion of the thermal bridge 210 is positioned in close proximity to the hot spot 102a, such as over, around, at, and/or coincident with the location of the hot spot 102a (e.g., the hottest spot of the SSD enclosure) as depicted in FIG. 2B. Furthermore, the thermal bridge 210 is preferably constructed, composed of a relatively highly thermally conductive material. Thus, thermal bridge 210 functions to conduct heat away from the hot spot 102a of SSD 102 and to the cold structure 203 (e.g., a secondary heat path). The thermal bridge 210 can further function to assist in convection of heat away from the hot spot 102a of SSD 102 (as depicted by the arrows of FIG. 2A), as the thermal bridge 210 may be positioned in the direction of cooling air flow (e.g., a primary heat path) such as from a cooling fan, while preferably not blocking the air flow in a significant manner. Note that the shape and configuration of the thermal bridge 210 as depicted in FIG. 2A is for purposes of example and simplicity, whereas the shape and configuration of a thermal bridge as described herein may vary from implementation to implementation.

According to an embodiment, the thermal bridge 210 is flexible and/or adjustable, in at least one direction (e.g., the vertical direction as illustrated in FIG. 2A), so that the thermal bridge is adjustable and/or configurable to bridge a first gap between the cold structure 203 and a corresponding first SSD 102 and to bridge a second gap between the cold structure 203 and a corresponding second SSD 102, where the first gap is different than the second gap (i.e., the distance associated with the first gap is different from the distance associated with the second gap). This flexibility of the thermal bridge 210 enables the thermal bridge 210 more versatility with respect to implementation in various environments/configurations in which the respective gap between different SSDs 102 and corresponding nearby cold structures 203 varies or is variable. This flexibility further enables ease of installation in a given data storage system environment.

In addition to the foregoing flexibility, according to an embodiment the thermal bridge 210 is configured with a desirable stiffness such that the thermal bridge 210 generates contact forces that are applied to/at the SSD 102 and the corresponding cold structure 203. For example and according to an embodiment, the thermal bridge is configured to function, operate as a compression-type spring, as illustrated and described in more detail in reference to FIG. 3.

Figure 3:
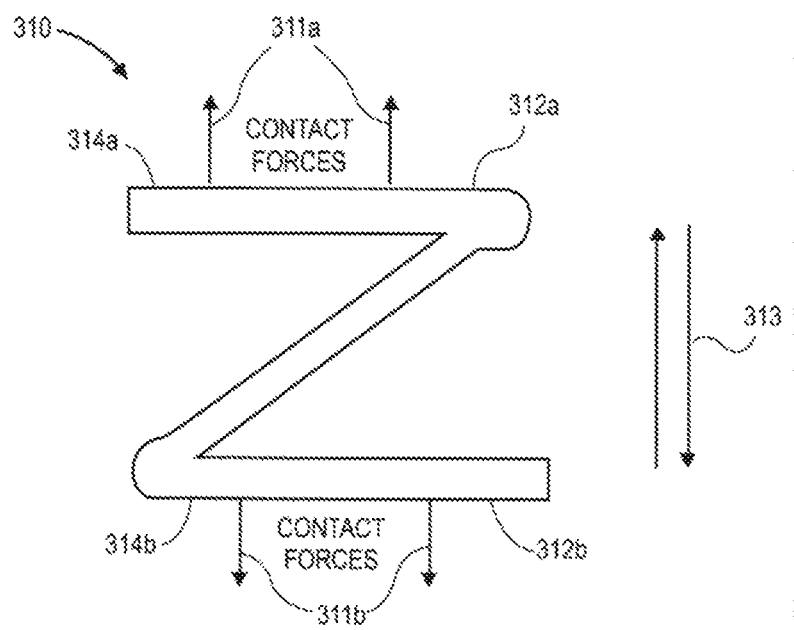
FIG. 3 is a diagrammatic side view illustrating a spring thermal bridge, according to an embodiment.

FIG. 3 is a diagrammatic side view illustrating a spring thermal bridge, according to an embodiment. According to an embodiment, thermal bridge 310 is structurally configured, designed to function or operate as a compression spring, i.e., generally, an elastic object that stores mechanical energy. Use of the term "compression spring" is not intended to limit the thermal bridge described herein throughout as a coil spring, as the term is commonly used. Rather, as illustrated in FIG. 3, a structure that is configured such that it functions with spring-like properties, such as by storing energy when compressed, need not comprise a series of coils. As illustrated, a thermal bridge as described herein throughout, for example thermal bridge 310, may be constructed, configured in a z-shape (resembling the letter "z") and possess the properties of a compression spring. As such, thermal bridge 310 generates contact forces 311a, 311b at respective sides, ends, contact surfaces 312a, 312b of the thermal bridge 310, such as contact forces 311a applied at/to the cold structure (e.g., cold structure 203 of FIG. 2A) and contact forces 311b applied at/to a corresponding data storage device (e.g., SSD 102 of FIGS. 1A-2B). Reference is made to FIG. 2B for an example of a footprint of a contact surface 312b.

One way to implement a highly thermally conductive spring-like thermal bridge, such as thermal bridge 310, is to construct the thermal bridge 310 primarily of copper material, according to an embodiment. According to a related embodiment, thermal bridge 310 is constructed of a bent copper sheet having a thickness in a range of 0.1-1.0 millimeter (preferably, around 0.5 mm has been found suitable for the intended purpose), configured generally as illustrated in FIG. 3 which, when compressed, operates how a compression spring commonly operates. Thus, contact forces 311a, 311b are generated, and the height (or "length"), i.e., the distance between the contact surfaces 312a, 312b, is adjustable (as depicted by arrows 313). While copper is preferable, aluminum or other conductive materials may also be suitable for the intended purpose. According to an embodiment, a thermal interface material (TIM) such as TIM 314a, 314b is applied to at least one of the thermal bridge (e.g., thermal bridge 310), the cold structure (e.g., cold structure 203), and the data storage device (e.g., SSD 102), at an area at which the thermal bridge is in contact with the cold structure and/or the data storage device.

Figure 4:
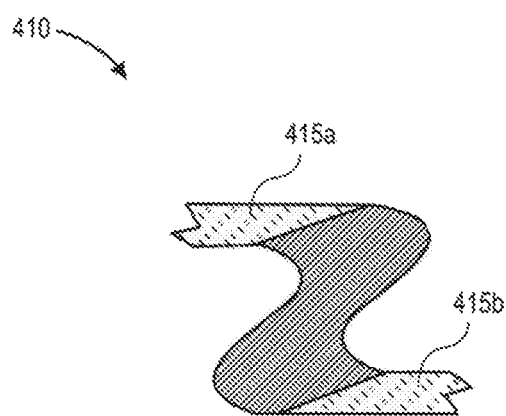
FIG. 4 is a diagrammatic perspective view illustrating a ribbon thermal bridge, according to an embodiment.

FIG. 4 is a diagrammatic perspective view illustrating a ribbon thermal bridge, according to an embodiment. According to an embodiment, thermal bridge 410 is constructed, composed primarily of a Pyrolytic Graphite Sheet (PGS) ribbon, which is considered a thermal interface material that is thin, synthetically manufactured from a highly oriented graphite polymer film, which is highly thermally conductive. Some PGS have been advertised as reaching a thermal conductivity several orders of magnitude over that of copper, with a density several orders of magnitude less than that of copper. Portions of the PGS 410 may comprise an adhesive layer, such as adhesive 415a, 415b at its ends, for adhering to the cold structure (e.g., cold structure 203 of FIG. 2A) and to the corresponding data storage device (e.g., SSD 102 of FIGS. 1A-2B). PGS 410 is considered highly conformable, enabling suitable contact to the respective surfaces.

Method of Reducing Temperature of an SSD Enclosure Hot Spot

Figure 5:
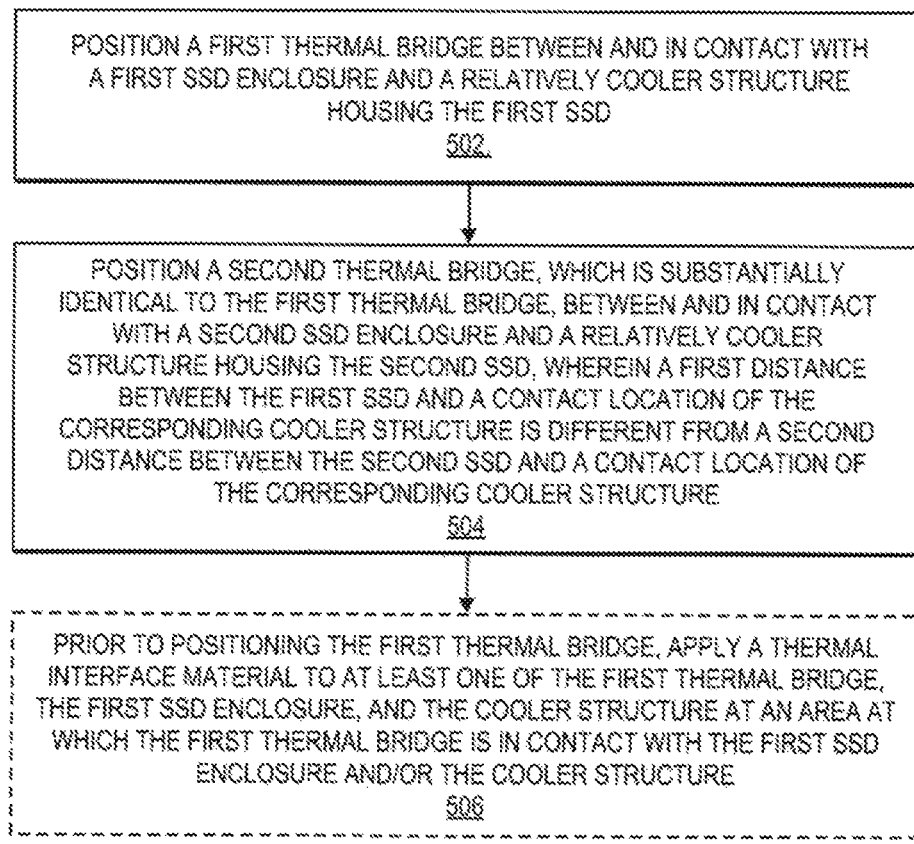
FIG. 5 is a flow diagram illustrating a method of reducing the temperature of a hot spot associated with a solid-state drive enclosure, according to an embodiment.

FIG. 5 is a flow diagram illustrating a method of reducing the temperature of a hot spot associated with a solid-state drive enclosure, according to an embodiment. For example, the method of FIG. 5 could be employed in a data storage system such as AFA 100 of FIGS. 1A, 1B.

At block 502, position a first thermal bridge between and in contact with a first SSD enclosure and a relatively cooler (i.e., lower in temperature) structure housing the first SSD. For example, thermal bridge 210 (FIG. 2A), 310 (FIG. 3), 410 (FIG. 4) is positioned between and in contact with an enclosure of a first SSD 102 (FIGS. 1A-2B) and the cold structure 203 (FIG. 2A).

At block 504, position a second thermal bridge, which is substantially identical to the first thermal bridge, between and in contact with a second SSD enclosure and a relatively cooler structure housing the second SSD. For example, thermal bridge 210, 310, 410 is positioned between and in contact with an enclosure of a second SSD 102 and the cold structure 203, wherein a first distance (gap) between the first SSD 102 and a contact location of the corresponding cold structure 203 is different from a second distance (gap) between the second SSD 102 and a contact location of the corresponding cold structure 203.

At optional block 506, prior to positioning the first thermal bridge, apply a thermal interface material to at least one of the first thermal bridge, the first SSD enclosure, and the cooler structure at an area at which the first thermal bridge is in contact with the first SSD enclosure and/or the cooler structure. For example, a TIM such as a thermally conductive paste, tape, or grease is applied to the thermal bridge 210, 310, the enclosure of the first SSD 102, and/or the cold structure 203 at the area of contact (or at least a portion thereof) between the respective components.

Hence, a flexible apparatus and a method are described for cooling down a localized hot spot associated with a data storage device such as an SSD (experimentation has shown a non-trivial 10%-18% body temperature reduction, for a non-limiting example), which contributes to lowering the temperature of the data storage system at large, at a significantly lower cost compared with a more powerful cooling fan and with no additional power consumption. Furthermore, a thermal bridge as illustrated and described herein is readily installable by a customer in the field.

Extensions and Alternatives

In the foregoing description, embodiments of the invention have been described with reference to numerous specific details that may vary from implementation to implementation. Therefore, various modifications and changes may be made thereto without departing from the broader spirit and scope of the embodiments. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

In addition, in this description certain process steps may be set forth in a particular order, and alphabetic and alphanumeric labels may be used to identify certain steps. Unless specifically stated in the description, embodiments are not necessarily limited to any particular order of carrying out such steps. In particular, the labels are used merely for convenient identification of steps, and are not intended to specify or require a particular order of carrying out such steps.

What is claimed is:

1. A data storage system comprising:
    a plurality of solid-state drives (SSDs) each comprising a drive enclosure;
    a system enclosure housing the plurality of SSDs; and
    a thermal bridge positioned in a gap between and in contact with each of the system enclosure and an SSD of the plurality of SSDs;
    wherein:
    the gap is a first gap having a first distance between the system enclosure and the SSD; and
    the thermal bridge is flexible in at least one direction such that the thermal bridge is operationally and non-permanently adjustable to alternatively bridge either the first gap or a second gap having a second different distance between the system enclosure and a second SSD of the plurality of SSDs.

2. The data storage system of claim 1, wherein the system enclosure is cooler than the SSD.

3. The data storage system of claim 1, wherein the thermal bridge is positioned in contact with the SSD at least in part coincident with a hot spot of the drive enclosure of the SSD.

4. The data storage system of claim 1, wherein the thermal bridge is configured with a stiffness such that the thermal bridge generates contact forces applied at the system enclosure and at the SSD.

5. The data storage system of claim 1, wherein the thermal bridge is configured to function as a compression spring.

6. The data storage system of claim 1, wherein the thermal bridge is constructed primarily of copper.

7. The data storage system of claim 1, wherein the thermal bridge is constructed of a bent copper sheet having a thickness in a range of 0.1 millimeter to 1.0 millimeter.

8. The data storage system of claim 1, wherein the thermal bridge is constructed primarily of a pyrolytic graphite sheet.

9. The data storage system of claim 1, further comprising:
    a thermal interface material (TIM) applied to at least one of the thermal bridge, the system enclosure, and the SSD at an area at which the thermal bridge is in contact with the system enclosure and/or the SSD.

10. A method of reducing a temperature of a hot spot associated with a solid-state drive (SSD) enclosure, the method comprising:
    positioning a thermal bridge between and in contact with the SSD enclosure, solely at a certain location proximal to the hot spot of the SSD enclosure, and a relatively cooler structure housing the SSD enclosure.

11. The method of claim 10, wherein positioning the thermal bridge comprises compressing the thermal bridge, thereby generating contact forces applied at the SSD enclosure and at the cooler structure.

12. The method of claim 10, wherein the thermal bridge is constructed of a bent copper sheet having a thickness in a range of 0.1 millimeter (mm) to 1.0 millimeter (mm) and a z-shaped form.

13. The method of claim 10, wherein the thermal bridge is constructed primarily of a pyrolytic graphite sheet.

14. The method of claim 10, further comprising:
prior to positioning the thermal bridge, applying a thermal interface material (TIM) to at least one of the thermal bridge, the SSD enclosure, and the cooler structure at an area at which the thermal bridge is in contact with the SSD enclosure and/or the cooler structure.

15. The method of claim 10, wherein the thermal bridge is a first thermal bridge between and in contact with a first SSD enclosure and a relatively cooler structure housing the first SSD enclosure, the method further comprising:
positioning a second thermal bridge, which is substantially identical to the first thermal bridge, between and in contact with a second SSD enclosure and a relatively cooler structure housing the second SSD;
wherein a first distance between the first SSD enclosure and a contact location of the corresponding cooler structure is different from a second distance between the second SSD enclosure and a contact location of the corresponding cooler structure.

\* \* \* \* \*